United States Patent
Zhai et al.

(10) Patent No.: US 7,990,149 B2
(45) Date of Patent: Aug. 2, 2011

(54) MR INVOLVING HIGH SPEED COIL MODE SWITCHING BETWEEN I-CHANNEL LINEAR, Q-CHANNEL LINEAR, QUADRATURE AND ANTI-QUADRATURE MODES

(75) Inventors: Zhiyong Zhai, Mayfield Heights, OH (US); Gordon D. DeMeester, Wickliffe, OH (US); Michael A. Morich, Mentor, OH (US); Paul R. Harvey, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 283 days.

(21) Appl. No.: 12/297,658

(22) PCT Filed: Apr. 3, 2007

(86) PCT No.: PCT/US2007/065844
§ 371 (c)(1),
(2), (4) Date: Oct. 20, 2008

(87) PCT Pub. No.: WO2007/124246
PCT Pub. Date: Nov. 1, 2007

(65) Prior Publication Data
US 2009/0201019 A1 Aug. 13, 2009

Related U.S. Application Data

(60) Provisional application No. 60/745,305, filed on Apr. 21, 2006.

(51) Int. Cl.
*G01V 3/00* (2006.01)
(52) U.S. Cl. .................................................. 324/322
(58) Field of Classification Search .......... 324/300–322; 600/410–435; 333/219–235; 343/876
See application file for complete search history.

(56) References Cited

U.S. PATENT DOCUMENTS

| | | | | | |
|---|---|---|---|---|---|
| 4,689,563 | A | * | 8/1987 | Bottomley et al. | 324/309 |
| 4,694,254 | A | * | 9/1987 | Vatis et al. | 324/309 |
| 4,766,383 | A | * | 8/1988 | Fox et al. | 324/318 |
| 6,608,480 | B1 | * | 8/2003 | Weyers | 324/318 |
| 6,946,840 | B1 | | 9/2005 | Zou et al. | |
| 6,975,114 | B1 | | 12/2005 | Ledden | |
| 6,985,701 | B2 | * | 1/2006 | Yoshida et al. | 455/76 |
| 7,733,980 | B2 | * | 6/2010 | Beukema et al. | 375/300 |
| 7,852,084 | B2 | * | 12/2010 | Zhai et al. | 324/318 |
| 7,902,937 | B2 | * | 3/2011 | Mu | 332/103 |

(Continued)

FOREIGN PATENT DOCUMENTS

| | | |
|---|---|---|
| EP | 1146348 A2 | 10/2001 |
| WO | 2004092760 A1 | 10/2004 |
| WO | 2006033047 A2 | 3/2006 |

*Primary Examiner* — Dixomara Vargas (57) ABSTRACT

Hybrid circuitry (40, 40', 40") for operatively coupling a radio frequency drive signal (70) with a quadrature coil (30) is configurable in one of at least two coil modes of a group consisting of: (i) a linear I channel mode in which an I channel input port (42) is driven without driving a Q channel input port (44); (ii) a linear Q channel mode in which the Q channel input port is driven without driving the I channel input port; (iii) a quadrature mode in which both the I and Q channel input ports are driven with a selected positive phase difference; and (iv) an anti quadrature mode in which both the I and Q channel input ports are driven with a selected negative phase difference. A temporal sequence of the at least two coil modes may be determined and employed to compensate for $B_1$ inhomogeneity.

23 Claims, 4 Drawing Sheets

U.S. PATENT DOCUMENTS

| | | |
|---|---|---|
| 2001/0033166 A1 | 10/2001 | Hoult et al. |
| 2002/0149365 A1 | 10/2002 | DeMeester et al. |
| 2002/0190716 A1 | 12/2002 | Misic |
| 2004/0012391 A1 | 1/2004 | Vaughan, Jr. et al. |
| 2004/0150401 A1 | 8/2004 | Eberler et al. |
| 2005/0099178 A1 | 5/2005 | King et al. |
| 2005/0110487 A1 | 5/2005 | Zhu |
| 2005/0174116 A1 | 8/2005 | Leussler et al. |
| 2005/0242816 A1 | 11/2005 | Kurpad et al. |

* cited by examiner

MR INVOLVING HIGH SPEED COIL MODE SWITCHING BETWEEN I-CHANNEL LINEAR, Q-CHANNEL LINEAR, QUADRATURE AND ANTI-QUADRATURE MODES

CROSS REFERENCE TO RELATED APPLICATIONS

This application claims the benefit of U.S. provisional application Ser. No. 60/745,305 filed Apr. 21, 2006, which is incorporated herein by reference.

The present application relates to the magnetic resonance arts. It is described with particular application to magnetic resonance imaging. However, it finds more general application in magnetic resonance processes in general, including magnetic resonance imaging, magnetic resonance spectroscopy, and so forth.

Quadrature body coils are commonly used in magnetic resonance scanners to provide efficient radio frequency coupling with a large region of interest such as a torso, legs, or other portion of a human imaging subject. A quadrature body coil typically is generally cylindrical in shape, and has radial symmetry. Examples include a quadrature birdcage body coil and a quadrature transverse-electromagnetic (TEM) body coil. The quadrature body coil includes I and Q channel input ports that are driven by radio frequency energy at a 90° phase difference to produce a rotating $B_1$ field for exciting magnetic resonance. The drive circuitry typically includes a single radio frequency amplifier generating a drive signal that is split by a hybrid circuit into two components destined for the I and Q channels, respectively. The hybrid circuit also phase-shifts the component that is destined for the Q channel by 90°.

The radial symmetry of quadrature body coils has traditionally been seen as a substantial advantage since it can be configured to produce a substantially uniform $B_1$ field over a large volume. However, when the coil is loaded, interaction of the input radio frequency energy with dielectric materials of the imaging subject (such as tissue, bone, blood, or so forth in the case of a human imaging subject) can produce large $B_1$ field non-uniformities across a slice or other imaging region. This is called coil loading, and becomes increasingly problematic as the asymmetry of the imaging subject increases (e.g., in the case of a "broad-shouldered" or otherwise asymmetric human imaging subject) and as the strength of the static (i.e., $B_0$) magnetic field increases. Hence, $B_1$ non-uniformity has become increasingly problematic as commercial magnetic resonance scanners have progressed from low-field (e.g., 0.23 Tesla, 1.5 Tesla) to progressively higher static magnetic fields (e.g., 3 Tesla, 7 Tesla, or so forth).

Various approaches have been used to address $B_1$ non-uniformity of quadrature body coils; however, each of these approaches have certain shortcomings.

In some approaches, a local transmit coil or coils array is used for magnetic resonance excitation. These approaches eliminate the use of the quadrature body coil in producing magnetic resonance excitation, which means that the advantages which have made quadrature body coils popular (such as large volume excitation, convenient mounting in the bore as a fixture or mounted on a slidably insertable annular former, well-defined unloaded $B_1$ field distribution, rotating $B_1$ field, and so forth) are lost.

In other approaches, two separate radio frequency amplifiers are used to drive the I and Q channel input ports. In some variant approaches, the rungs or rods of the quadrature body coil are configured to be degenerate and are driven separately or in groups by different radio frequency amplifiers. These approaches allow for relatively precise tailoring of the $B_1$ field distribution, but at the expense of additional radio frequency amplifiers. Since existing magnetic resonance scanners typically include a single radio frequency amplifier, the addition of another amplifier or group of amplifiers along with concomitant radio frequency cabling represents substantial retrofit expense and complexity.

In accordance with one aspect, hybrid circuitry is configured to operatively couple a radio frequency drive signal with a quadrature coil to drive the quadrature coil having an I channel input port and a Q channel input port. The hybrid circuitry is configurable in one of at least two coil modes selected from a group consisting of: (i) a linear I-channel mode in which the I channel input port is driven without driving the Q channel input port; (ii) a linear Q-channel mode in which the Q channel input port is driven without driving the I channel input port; (iii) a quadrature mode in which both the I and Q channel input ports are driven with a selected positive phase difference; and (iv) an anti-quadrature mode in which both the I and Q channel input ports are driven with a selected negative phase difference.

In accordance with another aspect, a method performed in conjunction with the hybrid circuitry of the preceding paragraph is disclosed. A temporal sequence is determined of the at least two coil modes that produces a radio frequency excitation that compensates for $B_1$ non-uniformity of the quadrature coil by a subject. Magnetic resonance is excited in the subject using the quadrature coil. The exciting includes operating the hybrid circuitry in accordance with the determined temporal sequence of the at least two coil modes.

In accordance with another aspect, a magnetic resonance scanner is disclosed. A main magnet generates a static magnetic field at least in a scanning region. A quadrature coil is coupled with the scanning region. The quadrature coil has an I channel input port and a Q channel input port. A radio frequency amplifier is configured to generate a radio frequency drive signal at about a magnetic resonance frequency. Hybrid circuitry operatively couples the radio frequency drive signal with the quadrature coil to drive the quadrature coil in a selectable one of at least two coil modes selected from a group consisting of: (i) a linear 1-channel mode in which the I channel input port is driven without driving the Q channel input port; (ii) a linear Q-channel mode in which the Q channel input port is driven without driving the I channel input port; (iii) a quadrature mode in which both the I and Q channel input ports are driven with a selected positive phase difference; and (iv) an anti-quadrature mode in which both the I and Q channel input ports are driven with a selected negative phase difference.

In accordance with another aspect, a method is disclosed for exciting magnetic resonance using a quadrature coil having I and Q channel input ports. A radio frequency drive signal is split into two drive signal components. At least one of the drive signal components is selectively modified to produce operative drive signal components, the selective modifying including at least one of: (i) phase-shifting at least one of the drive signal components by a positive or negative multiple of 90°; and (ii) terminating one of the drive signal components. The operative drive signal components are applied to the I-channel and Q-channel input ports of the quadrature coil to excite magnetic resonance.

In accordance with another aspect, an apparatus is disclosed for use in operating a quadrature coil having I and Q channel input ports to excite magnetic resonance. A circuit is configured to split a radio frequency drive signal into two drive signal components. Additional circuitry is configured to selectively modify the drive signal components to produce one of a discrete number of two or more coil operational modes.

One advantage resides in providing enhanced flexibility to account for $B_1$ non-uniformity of a quadrature body coil without the added expense of an additional radio frequency amplifier (or amplifiers) and associated radio frequency cabling.

Another advantage resides in providing convenient and effective retrofitting of existing magnetic resonance scanners.

Another advantage resides in simplified configuration of a magnetic resonance scanner to compensate for differing $B_1$ non-uniformity imposed by various body shapes.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
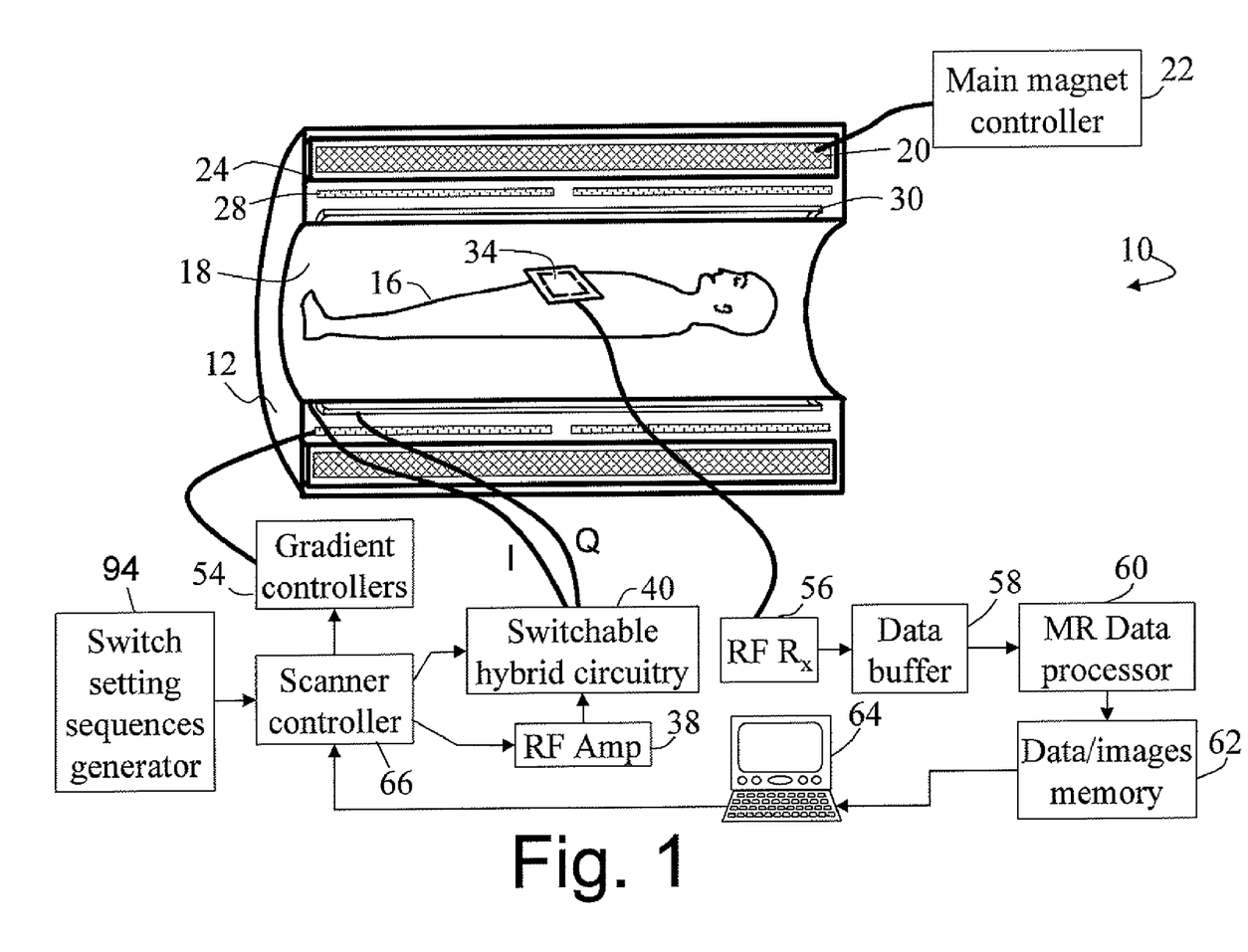
FIG. 1 diagrammatically shows a magnetic resonance scanner including switchable hybrid circuitry for operating the quadrature body coil in two or more different modes.

With reference to FIG. 1, a magnetic resonance scanner 10 includes a scanner housing 12 in which a patient 16 or other subject is at least partially disposed. Although described with reference to a bore-type scanner, it is to be appreciated that the scanner could also be an open-magnet scanner or other type of magnetic resonance scanner. A protective insulating bore liner 18 of the scanner housing 12 optionally lines a generally cylindrical bore or opening of the scanner housing 12 inside of which the subject 16 is disposed. A main magnet 20 disposed in the scanner housing 12 is controlled by a main magnet controller 22 to generate a static ($B_0$) magnetic field in at least a scanning region including at least a portion of the subject 16. Typically, the main magnet 20 is a persistent superconducting magnet surrounded by cryoshrouding 24. In some embodiments, the main magnet 20 generates a main magnetic field of at least about 0.2 Tesla, such as 0.23 Tesla, 1.5 Tesla, 3 Tesla, 7 Tesla, or so forth. Magnetic field gradient coils 28 are arranged in or on the housing 12 to superimpose selected magnetic field gradients on the main magnetic field in at least the scanning region. Typically, the magnetic field gradient coils include coils for producing three orthogonal magnetic field gradients, such as x-gradient, y-gradient, and z-gradient.

A generally cylindrical quadrature body coil 30 is mounted substantially coaxially with the bore of the magnetic resonance scanner 10. In some embodiments, the quadrature body coil 30 is a permanent fixture mounted inside the scanner housing 12. In some embodiments, the quadrature body coil 30 is mounted on a dielectric former or other holder that can be slidably inserted into and removed from the bore of the magnetic resonance scanner 10, or slidably inserted into and removed from an annular receptacle of the scanner housing 12. In some embodiments the quadrature coil 30 is a local quadrature volume coil for local anatomy imaging, such as a head quadrature coil or a knee quadrature coil. In some embodiments the quadrature body coil 30 is a quadrature birdcage coil including a plurality of rungs arranged generally parallel with the axis of the bore and operatively interconnected by two or more endrings, endcaps, or other terminating structures disposed at or near the opposite ends of the rungs. In some embodiments the quadrature body coil 30 is a quadrature transverse-electromagnetic (TEM) coil including a plurality of rods arranged generally parallel with the axis of the bore and operatively interconnected by a generally annular radio frequency shield or screen substantially surrounding the rods. The quadrature body coil 30 optionally includes capacitances, inductances, resistances, chokes, transistors, relays, or other components for providing radio frequency tuning, decoupling, current blocking or trapping, or other functionality.

In some embodiments, the quadrature body coil 30 performs both transmit and receive functions. That is, the quadrature body coil 30 is externally energized to excite magnetic resonance in the subject 16, and is also used to receive magnetic resonance signals generated by the excitation. In some embodiments, the quadrature body coil 30 performs the transmit function, and a separate receive coil 34 receives magnetic resonance signals generated by the excitation. The optional separate receive coil 34 can be a surface coil as illustrated, or a surface coils array, or an arm coil, leg coil, or other local coil. It is also contemplated to have the quadrature body coil 30 performs the transmit function, and to have a separate quadrature body coil (not shown) perform the receive function. In some embodiments, the scanner 10 is configurable so that in some imaging applications the quadrature body coil 30 performs both transmit and receive functions while in other imaging applications the quadrature body coil 30 performs the transmit function and a separate receive coil performs the receive function. The optional separate receive coil typically includes detuning circuitry that detunes the receive coil during the transmit phase to avoid overloading the receive coil.

Figure 2:
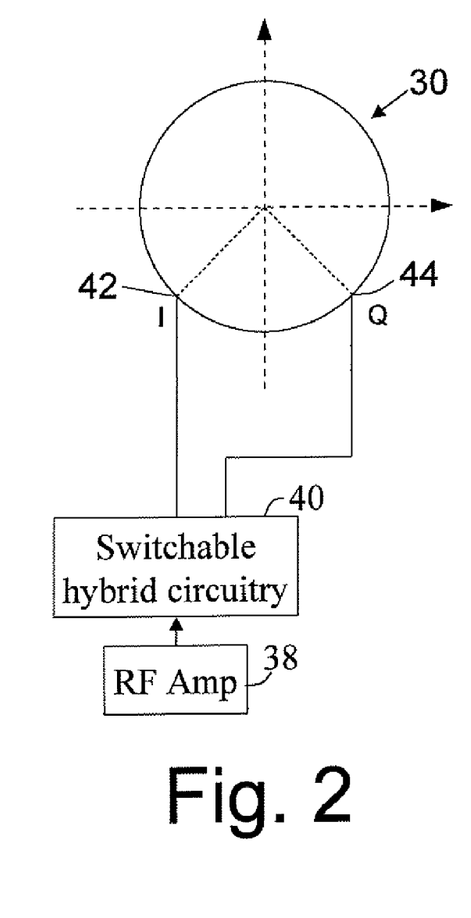
FIG. 2 diagrammatically shows the radio frequency excitation system of the scanner of FIG. 1, including the single radio frequency amplifier, the switchable hybrid circuitry, and the quadrature body coil.
Figure 3:
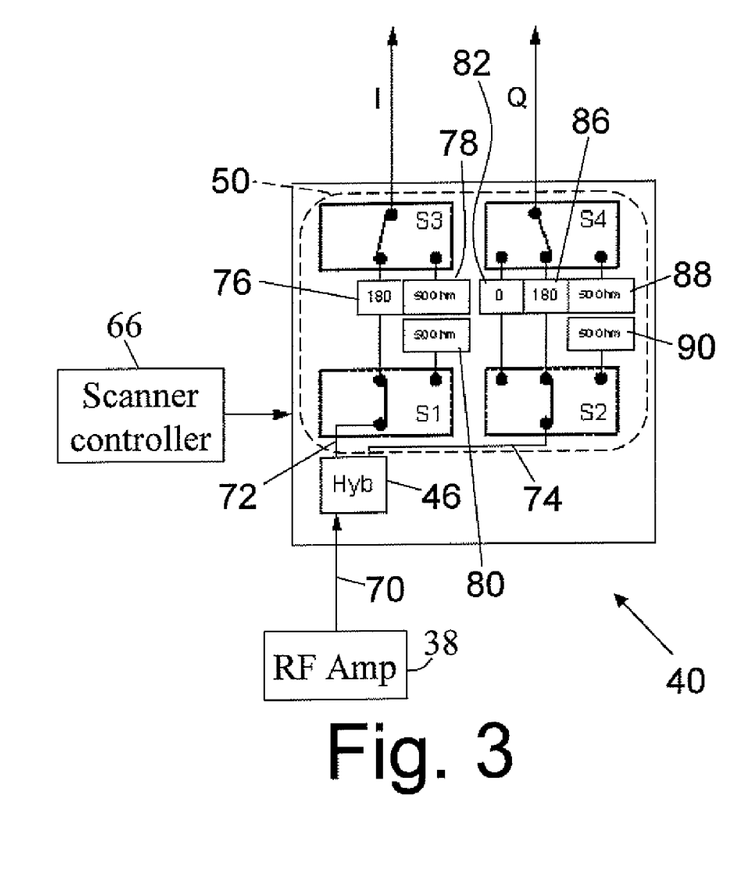
FIG. 3 diagrammatically shows details of the switchable hybrid circuitry of FIGS. 1 and 2.

With continuing reference to FIG. 1 and with further reference to FIGS. 2 and 3, during magnetic resonance spectroscopy data acquisition, a radio frequency amplifier 38 generates a radio frequency drive signal at about the magnetic resonance frequency. The drive signal is fed into hybrid circuitry 40 that in turn feeds into I and Q channel input ports 42, 44 of the quadrature body coil 30. The hybrid circuitry 40 includes a conventional hybrid circuit 46 that splits the radio frequency drive signal into two component drive signals and phase-shifts one of the split component drive signals by a selected phase shift, such as 90° so as to produce conventional quadrature drive signal components. The hybrid circuitry 40 further includes additional circuitry 50 which optionally modifies the output of the hybrid circuit 46 to produce drive signals for implementing a selected one of several discrete coil operational modes, such as: (i) a linear I-channel mode in which the I channel input port 42 is driven at a reference phase without driving the Q channel input port 44, (ii) a linear Q-channel mode in which the Q channel input port 44 is driven at the reference phase plus a selected phase offset without driving the I channel input port 42, (iii) a quadrature mode in which the I channel input port 42 is driven at the reference phase and the Q channel input port 44 is driven at the reference phase plus the selected phase offset, and (iv) an anti-quadrature mode in which the I channel input port 42 is driven at the reference phase and the Q channel input port 44 is driven by the radio frequency amplifier at the reference phase minus the selected phase offset. In some embodiments, the selected phase offset is 90°.

With continuing reference to FIG. 1, optionally a magnetic field gradients controller 54 operates the magnetic field gradient coils 28 to spatially localize the magnetic resonance excitation to a slab or other localized region. Optionally, the magnetic field gradient controller 54 operates the magnetic field gradient coils 28 to apply one or more spatial encoding magnetic field gradient pulses.

In the embodiment of FIG. 1, a radio frequency receiver 56 is operatively connected with the illustrated local coil 34 to read magnetic resonance signals during a readout phase of the magnetic resonance sequence. Alternatively, in some embodiments the radio frequency receiver 56 is operatively coupled with the I and Q channel input ports 42, 44 of the quadrature body coil 30 during the readout phase, with suitably radio frequency circuitry being provided to switch between operative connection of the quadrature body coil 30 with the hybrid circuitry 40 during the transmit phase and operative connection with the radio frequency receiver 56 during the readout phase. Optionally, the magnetic field gradient controller 54 operates the magnetic field gradient coils 28 during the readout phase to provide additional spatial encoding (i.e., readout encoding) of the magnetic resonance signals.

The magnetic resonance samples acquired during the readout are stored in a data buffer 58. A magnetic resonance data processor 60 performs processing of the acquired magnetic resonance data to extract useful information. In imaging applications, the data processor 60 suitably performs image reconstruction using a Fast Fourier transform or other image reconstruction algorithms comporting with the selected spatial encoding applied during generation of the magnetic resonance data. In spectroscopic applications, the processing performed by the data processor 60 may include, for example, performing spectral fast Fourier transform operations to recover chemical shift and J-coupling data. The resulting processed data (e.g., images, spectra, or so forth) are suitably stored in a data/images memory 62, displayed on a user interface 64, printed, communicated over the Internet or a local area network, stored on a non-volatile storage medium, or otherwise used. In the example configuration illustrated in FIG. 1, the user interface 64 also interfaces a radiologist or other operator with the scanner controller 66 to control the magnetic resonance scanner 10. In other embodiments, a separate scanner control interface may be provided.

With reference to FIG. 3, the switchable hybrid circuitry 40 is based on the conventional hybrid circuit 46 which outputs conventional quadrature drive signal components by splitting a radio frequency drive signal 70 output by the single radio frequency amplifier 38 into two component drive signals 72, 74 in which the component drive signals 74 designated for driving the Q-channel is phase-shifted by 90°. The additional circuitry 50 receives the component drive signals 72, 74 and selectively implements one of four coil operational modes by suitable settings of four high-speed switches designated in FIG. 3 as "S1", "S2", "S3", and "S4". The switches "S1" and "S3" operate on the drive signal 72 designated for the I-channel, and selectively apply one of a 180° phase shifter 76 or terminates the signal 72 and the I-channel input port 42 using a suitable impedances, such as illustrated 50-ohm impedances 78, 80 that match a conventional 50-ohm input impedance of the I-channel input port 42. (Other impedances can be used, typically selected to match the I-channel input port impedance). The switches "S2" and "S4" operate on the drive signal 74 designated for the Q-channel, and selectively apply one of a 0° phase shifter 82 (optionally implemented by a simple wired connection), a 180° phase shifter 86 or terminates the signal 74 and the Q-channel input port 44 using a suitable impedances, such as illustrated 50-ohm impedances 88, 90 that match a conventional 50-ohm input impedance of the Q-channel input port 44. (Other impedances can be used, typically selected to match the Q-channel input port impedance).

As detailed in Table 1, by selective operation of the four high-speed switches "S1", "S2", "S3", "S4" any one of four selectable coil modes can be selected. The component drive signals 72, 74 input to the additional circuitry 50 have the phases 0° (i.e., reference phase) and 90°, respectively. More generally, the hybrid circuit 46 imparts a selected phase shift between the reference phase of the component drive signal 72 and the phase of the drive signal 74. The phase differences of Table 1 assume that the hybrid circuit 46 imparts a 90° phase difference between the reference phase of the component drive signal 72 and the phase of the component drive signal 74. More generally, if the hybrid circuit 46 imparts a selected phase difference between the reference phase of the component drive signal 72 and the phase of the component drive signal 74, then the quadrature mode will drive both the I and Q channel input ports with the selected phase difference, whereas the anti-quadrature mode will drive both the I and Q channel input ports with a phase difference equal to the selected phase difference minus 180°.

TABLE 1

Coil operational modes for the hybrid circuitry of FIG. 3

| Mode | S1 | S2 | S3 | S4 | I-channel phase | Q-channel phase | Phase difference |
|---|---|---|---|---|---|---|---|
| Linear I-channel | 180° | 50Ω | 180° | 50Ω | 180° | 50Ω | — |
| Linear Q-channel | 50Ω | 180° | 50Ω | 180° | 50Ω | 270° | — |
| Quadrature | 180° | 180° | 180° | 180° | 180° | 270° | +90° |
| Anti-quadrature | 180° | 0° | 180° | 0° | 180° | 90° | −90° |

Optionally, the hybrid circuit 46 scales the component drive signals 72, 74 by first and second selected scaling factors, respectively. Such scaling may, for example, account for a non-isotropic volume of interest, a known typical asymmetry of the subject (e.g., a human subject lying on a support inside a horizontal bore typically has more mass along the horizontal direction versus the vertical direction due to the shoulders), or so forth. If the first and second selected scaling factors are equal, then a spatially isotropic $B_1$ field is typically generated in the quadrature and anti-quadrature mode fields in the absence of coil loading. Rather than implementing the first and second selected scaling factors in the hybrid circuit 46, these amplitude shifts can be implemented in the additional circuitry 50.

The switchable hybrid circuitry 40 of FIG. 3 is an example. Other circuits can be generated to provide two or more selectable coil operational modes. The switchable hybrid circuitry 40 of FIG. 3 incorporates the conventional hybrid circuit 46 which is a component of a typical conventional radio frequency excitation system employing a quadrature body coil. Accordingly, such an existing system is readily retrofitted to provide the selectable linear I-channel, linear Q-channel, quadrature, and anti-quadrature coil operational modes by adding the additional circuitry 50. However, it is to be understood that in other embodiments the hybrid circuit 46 may be replaced by hybrid circuitry that does not build upon the existing hybrid circuit 46.

Figure 4:
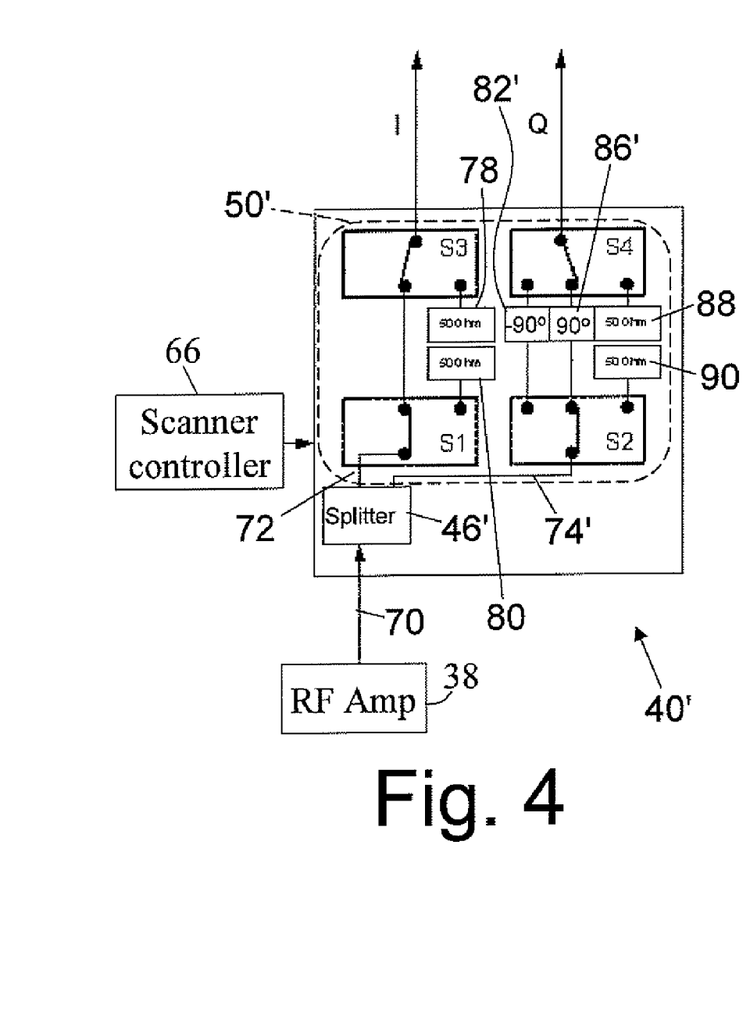
FIG. 4 diagrammatically shows different switchable hybrid circuitry which does not build upon an existing conventional hybrid circuit.

With reference to FIG. 4, for example, modified switchable hybrid circuitry 40' is similar to the hybrid circuitry 40 of FIG. 3, except that the conventional hybrid circuit 46 has been replaced by a signal splitter 46' that does not impart a 90° phase shift between the component drive signals 72, 74' (that is, the component drive signal 74' has the same phase as the component drive signal 72). To accommodate this change, modified additional circuitry 50' omits the 180° phase shifter 76 (replacing this by a direct wired connection providing a nominal 0° phase shift) and replaces the 0° and 180° phase shifters 82, 86 of FIG. 3 with −90° (i.e., 270°) and 90° phase shifters 82', 86'. The switch settings for the linear I-channel, linear Q-channel, quadrature, and anti-quadrature coil operational modes for the hybrid circuitry of FIG. 4 are shown in Table 2.

TABLE 2

Coil operational modes for the hybrid circuitry of FIG. 4

| Mode | S1 | S2 | S3 | S4 | I-channel phase | Q-channel phase | Phase difference |
|---|---|---|---|---|---|---|---|
| Linear I-channel | 0° | 50Ω | 0° | 50Ω | 0° | 50Ω | — |
| Linear Q-channel | 50Ω | 90° | 50Ω | 90° | 50Ω | 90° | — |
| Quadrature | 0° | 90° | 0° | 90° | 0° | 90° | +90° |
| Anti-quadrature | 0° | −90° | 0° | −90° | 0° | −90° | −90° |

Figure 5:
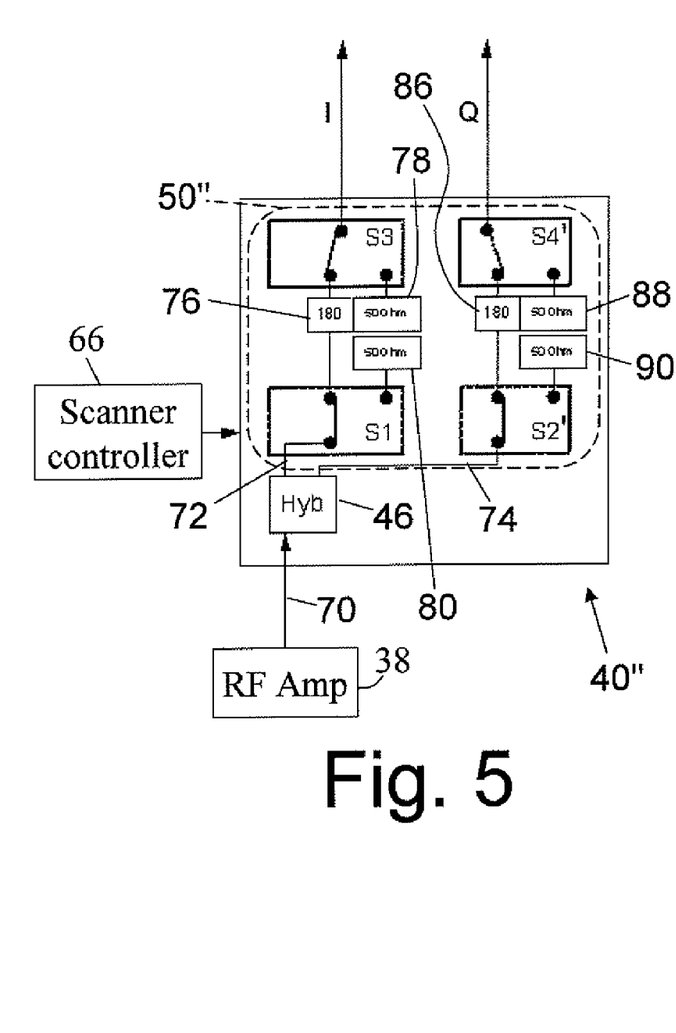
FIG. 5 diagrammatically shows different switchable hybrid circuitry which provides only the linear J-channel, linear Q-channel, and quadrature modes.

With reference to FIG. 5, another example hybrid circuitry 40" is shown, which is identical to the hybrid circuitry 40 of FIG. 3 except that the additional circuitry 50 is modified in FIG. 5 to produce additional circuitry 50" that omits the 0° phase shifter 82 and replaces three-way switches "S2" and "S4" by two-way switches "S2'" and "S4'". The effect of these changes is to omit the anti-quadrature mode. That is, the operation of the hybrid circuitry 40" of FIG. 5 is as set forth in Table 1, except that the anti-quadrature mode is not accessible.

The example hybrid circuitry 40, 40', 40" demonstrates that there are various ways to implement the disclosed switchable hybrid circuitry providing a plurality of discrete coil operational modes. These examples are not exhaustive—other circuit configurations can be constructed to provide identical coil operational modes, a sub-set of the linear I-channel, linear Q-channel, quadrature, and anti-quadrature operational modes, or additional or other coil operational modes.

In some embodiments, switches of the hybrid circuitry 40, 40', 40" are high-speed switches, for example operating in the millisecond, sub-millisecond, or faster range, so as to enable a time-averaging of the available coil operational modes within the timeframe of a single radio frequency excitation pulse or pulse packet. Some suitable high-speed switches are semiconductor-based electrically activated switches such as switching FET devices. By suitable time-averaging of, for example, the linear I-channel, linear Q-channel, quadrature, and anti-quadrature coil operational modes each operating with a selected radio frequency power or amplitude output by the radio frequency amplifier 38, spatial $B_1$ non-uniformity can be compensated.

Figure 6:
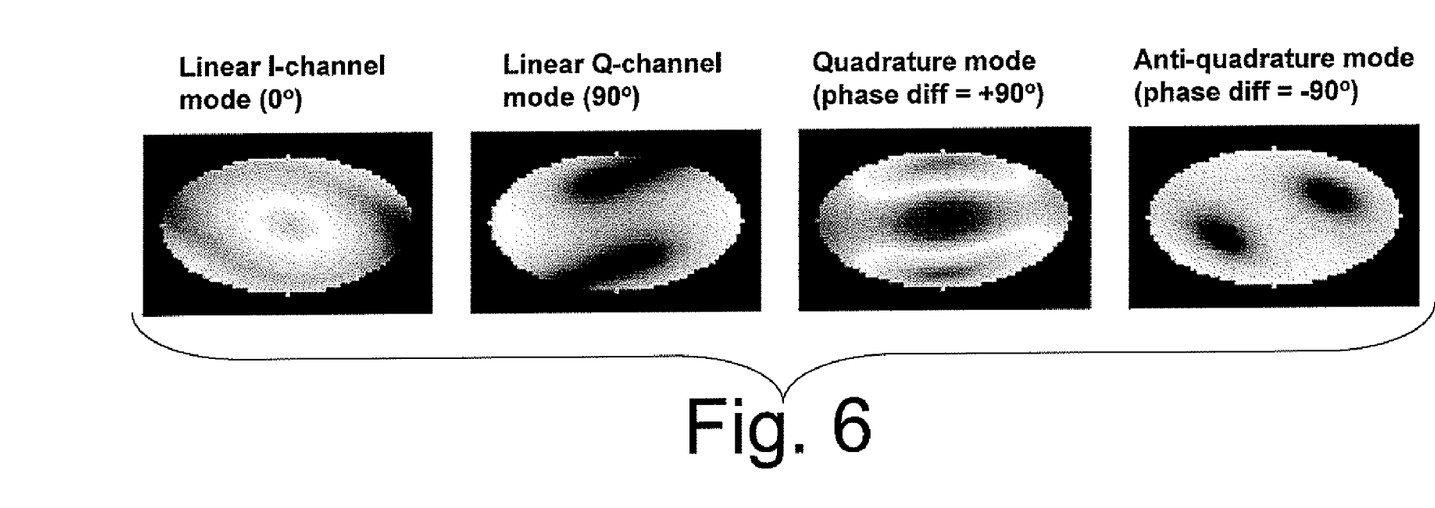
FIG. 6 shows the central transverse transmit $|B_1^+|$-fields for each of the linear I-channel, linear Q-channel, quadrature, and anti-quadrature coil operational modes for modeling of an elliptical cardiac phantom in a 3 Tesla static ($B_0$) magnetic field.

With reference to FIG. 6, the principle behind time-averaging compensation of $B_1$ non-uniformity is described. FIG. 6 shows the transmit $|B_1^+|$-fields for each of the linear I-channel, linear Q-channel, quadrature, and anti-quadrature coil operational modes implemented by the hybrid circuitry 40 for modeling of an elliptical cardiac phantom (aspect ratio=19 cm/35 cm=0.54, length=34 cm, conductivity=0.5 S/m and relative permittivity=78) placed in a quadrature body coil in a 3 Tesla static ($B_0$) magnetic field. In the $|B_1^+|$-field maps of FIG. 6 as well as the modified flip angle distributions of FIGS. 7 and 8), regions of about average $|B_1^+|$-field (flip angle) intensity are shown with whiter grayscale values, whereas regions of low or high $|B_1^+|$-field (flip angle) intensity are shown with darker grayscale values. That is, relatively uniform regions are whiter, while regions substantially contributing to non-uniformity are darker. Substantial spatial non-uniformities are seen for each of the coil operational modes, principally due to dielectric and eddy current effects in the cardiac phantom. A time-averaged $B_1$ field can be generated by switching between two or more of the coil operational modes during the generation of a single $B_1$ pulse or pulse packet using the hybrid circuitry 40, 40', 40". The flip angle provided by a given $B_1$ field over time is given by:

$$\theta = \int_0^\tau \gamma |B_1^+| dt, \qquad (1)$$

where γ is the gyromagnetic ratio. For a constant amplitude output by the radio frequency amplifier 38, the flip angle produced by the linear I-channel coil operational mode is suitably written as: $\gamma |B_1^+|_0° \cdot \tau_0°$ where $|B_1^+|_0°$ is the $B_1$ field distribution for the linear I-channel mode and $\tau_0°$ is the time over which the linear I-channel mode is applied. Similarly, the flip angle produced by the linear Q-channel coil operational mode is suitably written as: $\gamma |B_1^+|_{90}° \cdot \tau_{90}°$ where $|B_1^+$ $I_{90°}$ is the $B_1$ field distribution for the linear Q-channel mode and $\tau_{90°}$ is the time over which the linear Q-channel mode is applied. The flip angle produced by the quadrature coil operational mode is suitably written as: $\gamma |B_1^+|_q \cdot \tau_q$ where $|B_1^+|_q$ is the $B_1$ field distribution for the quadrature mode and $\tau_q$ is the time over which quadrature mode is applied. The flip angle produced by the anti-quadrature coil operational mode is suitably written as: $\gamma |B_1^+|_{aq} \cdot \tau_{aq}$ where $|B_1^+|_{aq}$ is the $B_1$ field distribution for the ant-quadrature mode and $\tau_{aq}$ is the time over which anti-quadrature mode is applied. The time-averaged output for time-averaging sequentially of the linear I-channel, linear Q-channel, quadrature, and anti-quadrature coil operational modes (neglecting any spin relaxation which is a good approximation for high-speed switching, i.e., sub-millisecond switching between operational modes) is given by the linear combination:

$$\theta = \gamma |B_1^+|_{0°} \cdot \tau_{0°} + \gamma |B_1^+|_{90°} \cdot \tau_{90°} + \gamma |B_1^+|_q \cdot \tau_q + \gamma |B_1^+|_{aq} \cdot \tau_{aq} \quad (2)$$

In effect, Equation (2) calls for a time-weighted combination of the four $B_1$ field patterns shown in FIG. 6 to generate an effective pulse or pulse packet of flip angle $\theta$.

Figure 7:
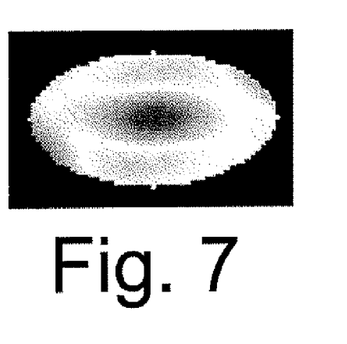
FIG. 7 shows the central transverse modified flip angle distribution for the elliptical cardiac phantom for a time-averaged radio frequency excitation pulse in which the linear I-channel and linear Q-channel modes are time-averaged sequentially with time durations of $\tau_{0°}=0.953\tau$ and $\tau_{90°}=0.753\tau$, respectively.

With reference to FIG. 7, in one approach improving the uniformity of overall flip angle, the linear I-channel and linear Q-channel modes are time-averaged sequentially with time durations of $\tau_{0°} = 0.953\tau$ and $\tau_{90°} = 0.753\tau$, where $\tau$ is a scaling factor selected to reach the desired radio frequency excitation pulse duration. The modulated flip angle $\theta = \gamma |B_1^+|_{0°} \tau_{0°} + \gamma |B_1^+|_{90°} \tau_{90°}$ then has the distribution shown in FIG. 7, with a unitless standard deviation of 0.188. That is a 40% decrease in standard deviation versus operation using a pure quadrature mode.

Figure 8:
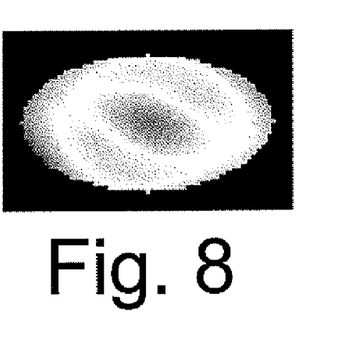
FIG. 8 shows the central transverse modified flip angle distribution for the elliptical cardiac phantom for a time-averaged radio frequency excitation pulse in which the quadrature and anti-quadrature modes are time-averaged sequentially with time durations of $\tau_a=0.492\tau$ and $\tau_{aq}=0.815\tau$, respectively.

With reference to FIG. 8, the result is shown when the quadrature and anti-quadrature modes are time-averaged sequentially with time durations of $\tau_a = 0.492\tau$ and $\tau_{aq} = 0.815\tau$. The modulated flip angle $\theta = \gamma |B_1^+|_a \tau_a + \gamma |B_1^+|_{aq} \tau_{aq}$ then has the distribution shown in FIG. 8, with a unitless standard deviation of 0.165. That is a 47% decrease in standard deviation versus operation using a pure quadrature mode.

The examples of FIGS. 7 and 8 each combine only two coil operational modes. Additional uniformity improvement is expected by combining three, four, or more different coil operational modes.

With reference back to FIG. 1, various techniques can be used to determine an appropriate combination of time-averaged modes to achieve improved spatial spin flip angle uniformity in a given subject. In general, a switch setting sequences generator 94 suitably determines the parameters time averaging parameters $\tau_0°$, $\tau_{90}°$, $\tau_q$, and $\tau_{aq}$ (or some sub-set of these parameters if not all coil operational modes are to be averaged, or equivalent parameters if the hybrid circuitry is configured to provide other operational modes). In one approach, the switch setting sequences generator 94 is a pre-determined and stored loading look-up table specifying switch setting sequences for the hybrid circuitry 40, 40', 40" to correct for corresponding $B_1$ non-uniformity due to coil loadings of various different sizes and aspect ratios. A magnetic resonance imaging pre-scan of the subject can be performed to determine the size and aspect ratio of the imaging object, and corresponding parameters for each discrete mode can be obtained through a look-up table. In other embodiments, the switch setting sequences generator 94 may include a finite element simulator that optimizes the parameters $\tau_{02}°$, $\tau_{90}°$, $\tau_q$, and $\tau_{aq}$ respective to a uniformity parameter using a dielectric map estimated from a pre-scan of the subject. In other embodiments, an analyzer or magnetic field sensor connected with the local coil 34 or with a dedicated probe can analyze or measure the actual $B_1$ flip angles achieved with each of a plurality of pilot pulses. The parameters can be adjusted dynamically or iteratively until the target flip angle uniformity is actually achieved.

The ordering of application of the linear I-channel, linear Q-channel, quadrature, and/or anti-quadrature modes in the time-averaged radio frequency excitation pulse sequencing is not critical. Depending upon the abruptness of the switching operations, there may be some advantage to using certain orderings that permit gradual or smoothed transitions from one mode to the next mode. For example, referencing Table 1, it is seen that a mode sequencing of linear I-channel/anti-quadrature/quadrature/linear Q-channel involves changing only two of the four switches "S1", "S2", "S3", "S4" for each transition, which may be advantageous in reducing transients.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. Hybrid circuitry comprising:
    a hybrid circuit or splitter that splits a radio frequency drive signal into two component drive signals; and
    additional circuitry including switches operable to couple one or both of the two component drive signals with a quadrature coil having an I channel input port and a Q channel input port to drive the quadrature coil;
    wherein the switches are configurable to drive the quadrature coil in a selected one of at least two coil modes selected from a group consisting of (i) a linear I-channel mode in which the I channel input port is driven by one of the two component drive signals without driving the Q channel input port, (ii) a linear Q-channel mode in which the Q channel input port is driven by one of the two component drive signals without driving the I channel input port, (iii) a quadrature mode in which the I channel input port is driven by one of the two component drive signals and the Q channel input port is driven by the other of the two component drive signals with a selected positive phase difference between the I and Q channels, and (iv) an anti-quadrature mode in which the I channel input port is driven by one of the two component drive signals and the Q channel input port is driven by the other of the two component drive signals with a selected negative phase difference between the I and Q channels.

2. The hybrid circuitry as set forth in claim 1, wherein the positive and negative selected phase differences are +90° and −90°, respectively.

3. The hybrid circuitry as set forth in claim 2, wherein the at least two coil modes include all four coil modes (i), (ii), (iii), and (iv).

4. The hybrid circuitry as set forth in claim 1, wherein the switches are switchable between coil modes with a sub-millisecond switching speed to enable shaping of a temporal variation of a radio frequency excitation pulse to compensate for coil loading.

5. The hybrid circuitry as set forth in claim 1, wherein the hybrid circuitry scales the driving of the I channel input port by a first preset scaling factor and the hybrid circuitry scales the driving of the Q channel input port by a second preset scaling factor.

6. The hybrid circuitry as set forth in claim 5, wherein the first preset scaling factor equals the second preset scaling factor.

7. A method performed in conjunction with the hybrid circuitry of claim 1, the method comprising:
- determining a temporal sequence of the at least two coil modes that produces a radio frequency excitation that compensates for $B_1$ non-uniformity of the quadrature coil by a subject; and
- exciting magnetic resonance in the subject using the quadrature coil, the exciting including operating the switches of the hybrid circuitry in accordance with the determined temporal sequence of the at least two coil modes.

8. The method as set forth in claim 7, wherein the quadrature coil is one of a quadrature body coil and a quadrature head coil.

9. A magnetic resonance scanner comprising:
- a main magnet for generating a static magnetic field at least in a scanning region;
- a quadrature coil coupled with the scanning region, the quadrature coil having an I channel input port and a Q channel input port;
- a radio frequency amplifier configured to generate a radio frequency drive signal at about a magnetic resonance frequency; and
- the hybrid circuitry as set forth in claim 1.

10. The magnetic resonance scanner as set forth in claim 9, wherein the quadrature coil is one of a quadrature body coil and a quadrature head coil.

11. The magnetic resonance scanner as set forth in claim 9, wherein the at least two coil modes include all four coil modes (i), (ii), (iii), and (iv).

12. The magnetic resonance scanner as set forth in claim 9, wherein the selected positive phase difference is +90° and the selected negative phase difference is −90°.

13. The magnetic resonance scanner as set forth in claim 12, wherein the hybrid circuit or splitter includes:
- a hybrid circuit that splits the radio frequency drive signal into two component drive signals with a 90° phase difference therebetween.

14. The magnetic resonance scanner as set forth in claim 13, wherein the additional circuitry additionally includes one or more phase shifters.

15. The magnetic resonance scanner as set forth in claim 9, further including:
- a switch setting sequences generator for generating a switch setting sequence executable by the switches of the hybrid circuitry to correct for a corresponding $B_1$ non-uniformity during magnetic resonance excitation.

16. The magnetic resonance scanner as set forth in claim 15, wherein the switch setting sequences generator includes:
- a loading look-up table specifying switch setting sequences for the hybrid circuitry to correct for corresponding $B_1$ non-uniformity.

17. An apparatus comprising:
hybrid circuitry including:
- a hybrid circuit or splitter that splits a radio frequency drive signal into two component drive signals; and
- additional circuitry including phase shifters and switches, the additional circuitry being configurable by the switches to drive the quadrature coil in a selected one of a plurality of coil modes including at least two coil modes selected from a group consisting of (i) a linear I-channel mode in which the I channel input port is driven by one of the two component drive signals and the Q channel input port is not driven, (ii) a linear Q-channel mode in which the Q channel input port is driven by one of the two component drive signals and the I channel input port is not driven, (iii) a quadrature mode in which the I channel input port is driven by one of the two component drive signals and the Q channel input port is driven by the other of the two component drive signals with a positive 90° phase difference between the I and Q channels, and (iv) an anti-quadrature mode in which the I channel input port is driven by one of the two component drive signals and the Q channel input port is driven by the other of the two component drive signals with a negative 90° phase difference between the I and Q channels.

18. The apparatus of claim 17, wherein the hybrid circuit or splitter of the hybrid circuitry comprises:
- a hybrid circuit that splits the radio frequency drive signal into two component drive signals with a 90° phase difference therebetween.

19. The apparatus of claim 17, wherein the hybrid circuit or splitter of the hybrid circuitry comprises:
- a splitter that splits the radio frequency drive signal into two component drive signals with a 0° phase difference therebetween.

20. The apparatus as set forth in claim 17, wherein the additional circuitry of the hybrid circuitry is configurable by the switches to drive the quadrature coil in a selected one of a plurality of coil modes including all four coil modes (i), (ii), (iii), and (iv).

21. The apparatus as set forth in claim 17, wherein the additional circuitry of the hybrid circuitry is configurable by the switches to drive the quadrature coil in a selected one of a plurality of coil modes including the three coil modes (i), (ii), (iii), but not including the anti-quadrature coil mode (iv).

22. The apparatus of claim 17, further comprising:
- a quadrature coil including I and Q input ports connected with the hybrid circuitry so as to drive the quadrature coil using the hybrid circuitry.

23. The apparatus of claim 22, further comprising:
- a single radio frequency amplifier connected to input the radio frequency drive signal to the hybrid circuit or splitter of the hybrid circuitry.

\* \* \* \* \*